US008590485B2

(12) United States Patent
Biloiu et al.

(10) Patent No.: US 8,590,485 B2
(45) Date of Patent: Nov. 26, 2013

(54) SMALL FORM FACTOR PLASMA SOURCE FOR HIGH DENSITY WIDE RIBBON ION BEAM GENERATION

(75) Inventors: Costel Biloiu, Rockport, MA (US); Jay Scheuer, Rowley, MA (US); Joseph Olson, Beverly, MA (US); Frank Sinclair, Quincy, MA (US); Daniel Distaso, Merrimac, MA (US)

(73) Assignee: Varian Semiconductor Equipment Associates, Inc., Gloucestor, MA (US)

(*) Notice: Subject to any disclaimer, the term of this patent is extended or adjusted under 35 U.S.C. 154(b) by 842 days.

(21) Appl. No.: 12/767,125

(22) Filed: Apr. 26, 2010

(65) Prior Publication Data

US 2011/0259269 A1    Oct. 27, 2011

(51) Int. Cl.
 C23C 16/00    (2006.01)
 C23F 1/00     (2006.01)
 H01L 21/306   (2006.01)
 H05B 31/26    (2006.01)

(52) U.S. Cl.
 USPC ............ 118/723 I; 118/723 IR; 118/723 AN; 118/723 MR; 118/723 MA; 156/345.48; 156/345.49; 315/111.51; 315/111.81

(58) Field of Classification Search
 USPC ........ 118/723 I, 723 IR; 156/345.48, 345.49; 315/111.51, 111.81
 See application file for complete search history.

(56) References Cited

U.S. PATENT DOCUMENTS

| 4,990,229 | A    |   | 2/1991  | Campbell et al. |
| 5,122,251 | A    |   | 6/1992  | Campbell et al. |
| 5,759,280 | A    | * | 6/1998  | Holland et al. .............. 118/723 I |
| 5,767,628 | A    | * | 6/1998  | Keller et al. ............. 315/111.51 |
| 6,271,529 | B1   | * | 8/2001  | Farley et al. ............. 250/492.21 |
| 6,504,159 | B1   | * | 1/2003  | Keller ....................... 250/423 R |
| 6,664,548 | B2   |   | 12/2003 | Benveniste et al. |
| 7,176,469 | B2   |   | 2/2007  | Leung et al. |
| 2001/0023741 | A1 | * | 9/2001  | Collison et al. .............. 156/345 |
| 2003/0193294 | A1 |   | 10/2003 | Wahlin |
| 2003/0197129 | A1 | * | 10/2003 | Murrell et al. ............ 250/423 R |
| 2003/0205680 | A1 | * | 11/2003 | Benveniste et al. ....... 250/423 R |
| 2004/0094509 | A1 | * | 5/2004  | Miyata et al. .................... 216/70 |
| 2008/0070389 | A1 |   | 3/2008  | Yamazaki et al. |
| 2010/0006539 | A1 | * | 1/2010  | Yang et al. ...................... 216/37 |
| 2010/0055345 | A1 |   | 3/2010  | Biloiu et al. |

FOREIGN PATENT DOCUMENTS

| JP | 1043960 A    | 2/1989 |
| JP | 2004158272 A | 6/2004 |

OTHER PUBLICATIONS

English Machine Translation JP2004158272, Ueda et al dated Jun. 3, 2004.*

(Continued)

*Primary Examiner* — Rakesh Dhingra (57) ABSTRACT

An ion source, capable of generating high-density wide ribbon ion beam, utilizing inductively coupled plasma production is disclosed. As opposed to conventional ICP sources, the present disclosure describes an ICP source which is not cylindrical. Rather, the source is defined such that its width, which is the dimension along which the beam is extracted, is greater than its height. The depth of the source may be defined to maximize energy transfer from the antenna to the plasma. In a further embodiment, a multicusp magnetic field surrounding the ICP source is used to further increase the current density and improve the uniformity of the extracted ion beam. Ion beam uniformity can also be controlled by means of several independent controls, including gas flow rate, and input RF power.

20 Claims, 10 Drawing Sheets

(56) References Cited

OTHER PUBLICATIONS

Siegfried, D., et al., Radio frequency linear ion beam source with 6 cm×66 cm beam, Review of Scientific Instruments, American Institute of Physics, Feb. 1, 2000, pp. 1029-1031, Melville, NY, USA.

J.H. Vainionpaa et al., "Ion Source for Neutral Beam Injection Meant for Plasma and Magnetic Field Diagnostics," Rev. of Sci. Instrum., 2008, pp. 1-3, 02C102.

* cited by examiner

SMALL FORM FACTOR PLASMA SOURCE FOR HIGH DENSITY WIDE RIBBON ION BEAM GENERATION

BACKGROUND OF THE INVENTION

Ion implanters are commonly used in the production of integrated circuits to create in a semiconductor wafer, usually silicon, regions of different conductivity by p-type or n-type doping. In such devices, a plasma source is used to ionize the dopant gas. A beam of positive ions is extracted from the source, accelerated to the desired energy, mass filtered and then directed toward the wafer. As the ions strike the wafer, they penetrate to a certain depth (depending on their kinetic energy and mass) and create regions of different electrical conductivity (depending on the dopant element concentration) into the wafer. The n-doping or p-doping nature of these regions, along with their geometrical configuration on the wafer, define their functionality, e.g., n-p-n or p-n-p junctions within the transistors. Through interconnection of many such doped regions, the wafers can be transformed into complex integrated circuits.

The amount of ion beam current is given by the rate of ion extraction from the plasma source, as shown in Equation 1:

$$dN_{extr}/dt \approx An_{si}v_B \qquad (1)$$

where $A = h_0 \times w_0$ is the cross-sectional area of the extraction aperture (with $h_0$ and $w_0$, the slit height and width, respectively), $n_{si}$ the ion density at the plasma sheath edge (approximately equal to 0.61 times electron bulk density $n_e$), and $v_B = (k_B T_e/m_i)^{1/2}$ the Bohm velocity (with $k_B$, $T_e$ and $m_i$ the Boltzmann constant, electron temperature and ion mass, respectively). Since the ion Bohm velocity for the same ionic species varies with the square root of the electron temperature, which is a slight function of plasma operating parameters, the attainable plasma density is the characteristic of interest in designing an ion source. The prior art showed that a limited number of plasma sources have proved to have sufficient plasma density to be useful as ion sources. In some embodiments, such as Bernas sources, an arc discharge creates the plasma. A flux of electrons generated by thermionic emission from tungsten filaments is used to generate and sustain the high arc plasma density. In other embodiments that use a form of arc discharge, such as indirectly heated cathodes (IHC), to reduce detrimental exposure of the filament to the plasma and therefore to extend the lifetime of the source, the necessary electrons are provided by thermionic emission from an indirectly heated cathode.

Arc based plasma sources create an acceptable amount of extracted beam current and therefore are used as ion sources on most of the present ion implanters in the semiconductor industry. However, arc based plasma sources have limited scalability. As can be seen in Equation 1, another factor that can be used for increasing the ion beam current is the cross-sectional area of the extraction slit. For a ribbon beam for which a rectangular extraction slit is used, the slit height is limited by the extraction optics, which requires narrow extraction slits for low aberration effects. Therefore the slit height is usually only a few millimeters. The slit width is limited by the availability of plasma sources to create plasmas having uniform density over large spatial dimensions. Even with the use of external magnetic fields to improve the uniformity of the plasma, arc discharge based ion sources cannot provide satisfactory (<5%) uniformity for slits wider than 90 mm. Therefore, in order to allow ion implantation of the current 300 mm diameter silicon wafer industry standard, the ion beam has to be expanded; a process that implies significant loss of beam current. For high-throughput solar cell applications or for the next generation 450 mm diameter wafer standard, wide ribbon ion beams and consequently plasma sources having good uniformity over at least 450 mm have to be developed.

One possible candidate is the inductively coupled plasma source (ICP). Unlike arc discharges, where the plasma is bounded to the arc electrodes, in this discharge, the plasma is produced by coupling the power from an RF generator to the working gas through an antenna. The high RF currents, i(t), flowing through the antenna give rise to a time varying magnetic field, B(t), as shown in Equation 2:

$$B(t) \sim i(t) \qquad (2)$$

which, according to the Maxwell's $3^{rd}$ electrodynamics law, as shown in Equation 3:

$$\mathrm{curl}\vec{E} = \partial \vec{B}/\partial t \qquad (3)$$

produces intense electric fields, E, in a spatial region located in the vicinity of the antenna. Thus, electrons acquire energy from the induced electric field and are able to ionize the gas atoms and/or molecules by ionizing collisions. As the current flowing through the antenna is increased (proportional with the applied RF power), the induced electric field and implicitly the energy gained by electrons is likewise increased. Usually this power transfer from the RF source to the plasma electrons takes place within a skin depth layer in the vicinity of the RF window through ohmic (collisional) or stochastic (collisionless) heating. For collision-dominated plasmas the thickness of the layer is given by Equation 4:

$$\delta = \left(\frac{2}{\omega \mu_0 \sigma}\right)^{1/2} \qquad (4)$$

where $\omega = 2\pi f$ is the RF pulsation (f is the RF frequency), $\mu_0 = 4\pi \times 10^{-7}$ H/m is the magnetic permeability of vacuum, and $\sigma$, as defined by Equation 5:

$$\sigma = \frac{ne^2}{m_e v_c} \qquad (5)$$

is the dc plasma conductivity (with n, e, $m_e$, and $v_c$ the electron density, charge, mass and collision frequency, respectively). For typical ICP plasma densities of approximately $10^{11}$ cm$^{-3}$, the skin layer thickness is typically few centimeters.

Figure 1A:
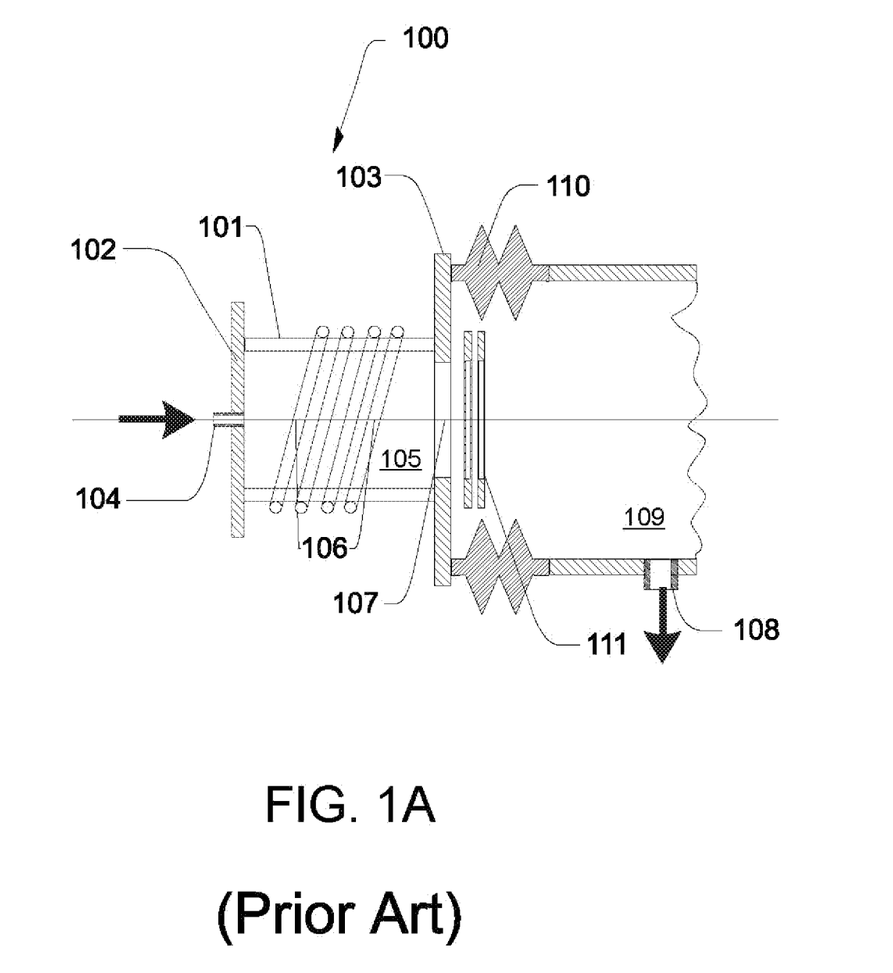
FIG. 1A illustrates a ICP source of the prior art.

Most of the ICP sources described in prior art are cylindrically shaped. FIG. 1A shows a cross-section of a prior art ICP plasma source 100. A dielectric cylinder 101 is preferably used to contain the low pressure gas and to allow RF power transmission. The cylinder is vacuum sealed at the two open ends by two metal flanges 102 and 103. For proper functioning, the gas pressure within the dielectric cylinder 101 may be maintained at less than 20 mTorr by a gas flow-gas pumping system (not shown) that employs mass flow controllers, vacuum valves, and vacuum pumps. The near flange 102 has an inlet 104 through which the desired working gas is fed into the plasma chamber 105 at a certain flow rate. The RF antenna 106 is tightly wrapped around the dielectric cylinder 101. The dielectric cylinder 101 can be comprised of any suitable material such as pyrex, quartz, or alumina. In other embodiments, a spiral shaped antenna in conjunction with a circular dielectric window and a metal cylinder are used. The RF antenna 106 is energized by an rf generator (not shown). The RF matching to the variable plasma impedance is accomplished by a matching network (not shown). The energy transferred by the RF antenna 106 to the free electrons is used to ionize the gas within the chamber 105. The distal flange 103 has a larger opening 107 to allow for vacuum pumping through the pumping port 108. A second vacuum chamber 109, electrically insulated from the flange 103 by an insulating bushing 110, contains the optics 111 used to extract the ion beam. The extraction electrodes are typically placed at the end of the cylindrical plasma chamber 105, and are aligned along a diameter of the dielectric cylinder 101.

Figure 1B:
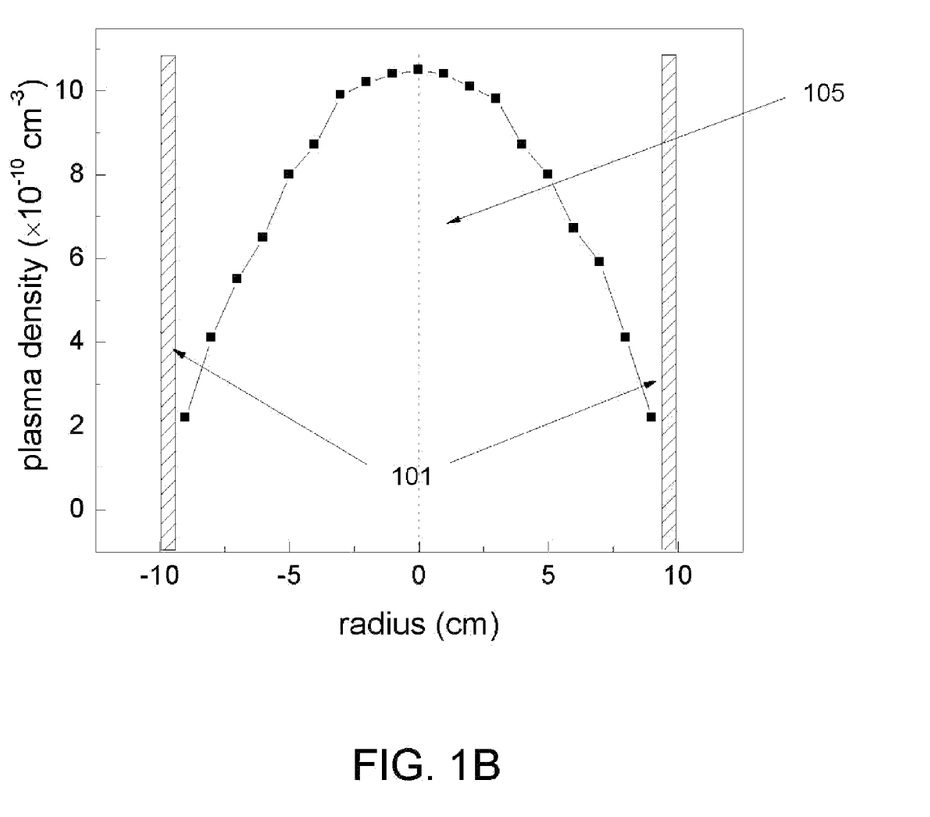
FIG. 1B illustrates the radial plasma density profile for the plasma source shown in FIG. 1A.

The drawback for this geometry is that the plasma is radially non-uniform, i.e., the plasma column has a very peaked density profile on the axis of the discharge. This non-uniform plasma density profile along radial direction characteristic limits the application of this geometry for large area plasma processing. As seen in FIG. 1B, the plasma density peaks at the center of the plasma chamber 105 and decreases sharply toward the walls of the dielectric cylinder 101. For ion implantation, it follows that such a density profile can be best used for small spot-like beams, with a useful diameter of few centimeters. However, for large ion implantation throughput, a wide and high current density ribbon ion beam is desirable. Even used in conjunction with diffusion chambers to improve the radial uniformity, such plasma sources will need tremendous amount of power to create a reasonable plasma density ($\sim 10^{10}$-$10^{11}$ cm$^{-3}$) across a diameter of 500-600 mm diameter.

Therefore, an ion source that can effectively utilize the relatively high plasma density produced by the ICP plasma sources but create a wide and uniform ribbon ion beam would be beneficial from ion implantation perspective.

SUMMARY OF THE INVENTION

The problems of the prior art are addressed by the present disclosure, which describes an ion source, capable of generating a wide and uniform ribbon ion beam utilizing an ICP plasma source. As opposed to conventional ICP sources, the present disclosure describes an ICP source which is not cylindrical. Rather, the source is defined such that its width, which is the dimension along which the beam is extracted, is greater than its height. The depth of the source may be defined to maximize energy transfer from the antenna to the plasma but to allow a long enough diffusion length for good plasma uniformity in the ion beam extraction region. The result is a plasma source having a small form factor (defined as the ratio between the plasma chamber depth and the geometrical mean of the chamber height and width) that allows an optimal RF power deposition and consequently, high plasma density ($\sim 5 \times 10^{11}$-$10^{12}$ cm$^{-3}$).

DETAILED DESCRIPTION OF THE INVENTION

Figure 2A:
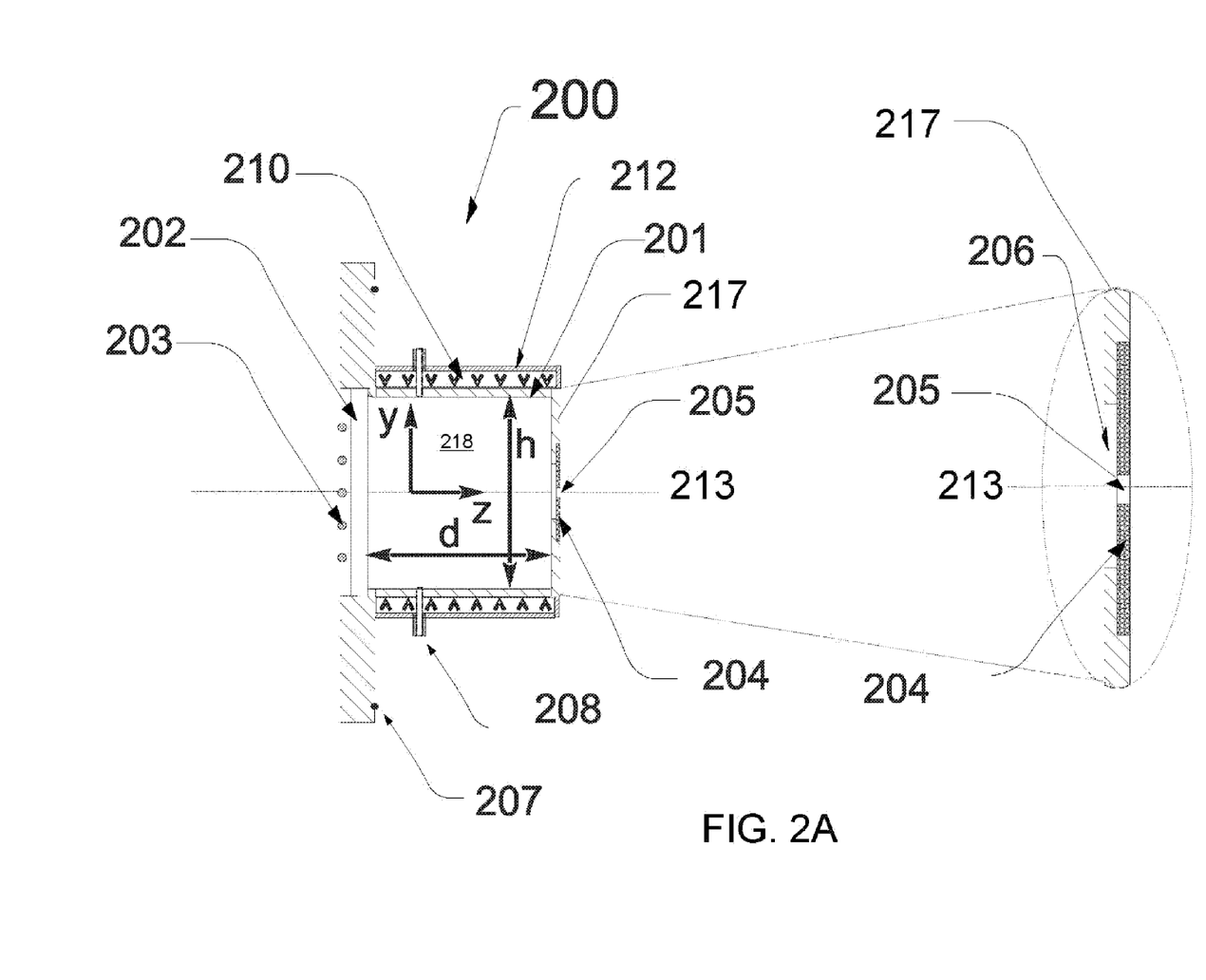
FIG. 2A shows a vertical cross section of an ICP plasma source according to one embodiment.

FIGS. 2A-D show the main components of an ICP plasma source 200 according to the present disclosure. A vertical cross-section (in the yz plane) through the center of the plasma source 200 is shown in FIG. 2A. A chamber body 201 preferably made of aluminum is used to contain the low pressure gas and to allow plasma generation. In some embodiments, the chamber body 201 may have a height (h) of 150 mm and a depth (d) of 140 mm. The front side of the source 200 includes a dielectric window 202, vacuum sealed against the chamber body 201. The dielectric window 202 can be constructed of quartz, alumina, alon, sapphire or any other suitable dielectric material. The thickness of the dielectric window 202 may be calculated such that the material is able to sustain approximately 1 atm pressure difference under approximately 200-300° C. thermal stress. In some embodiments, a 2.5 cm thick quartz window is used, while in other embodiments, a 19 mm 98% alumina window or an 8 mm sapphire window can be employed. Located in close proximity and parallel to the dielectric window 202 is a planar spiral antenna 203, which couples the energy from an RF power generator (not shown) to the electrons, which then dissociate and ionize the gas molecules contained within the chamber body 201. The planar spiral antenna 203 is preferably made of copper tubing to allow cooling. The matching of the 50Ω RF generator output impedance to the variable plasma impedance is accomplished by a matching network (not shown).

The plasma chamber back wall 217 (opposite to the dielectric window 202) has a slot to accommodate a face plate 204 that contains the beam extraction slit 205. The extraction slit is preferably at the vertical midline 213. The plasma chamber body 201, the dielectric window 202 and the back wall 217 define a chamber 218. As shown in the expanded view, the opening 206 in the plasma chamber is taller than the extraction slit 205 to prevent plasma edge effects. The plasma source 200 is mounted on a larger vacuum chamber (not shown) and vacuum sealed with the high temperature fluorocarbon O-ring 207. The working gases flows are regulated by mass flow controllers (not shown) and then sent to a common input gas line. In some embodiments, the gases are introduced into the plasma chamber body 201 through two gas inlets 208 that are placed symmetrically on the top and bottom of the chamber body 201. These gas inlets 208 are placed a distance, such as 5 centimeters, away from the dielectric window 202 in z direction. In some embodiments, vacuum pumping is accomplished through the extraction slit 205. In this embodiment, the previously described feeding-pumping geometry ensures a uniform gas distribution inside the plasma source 200.

Figure 2B:
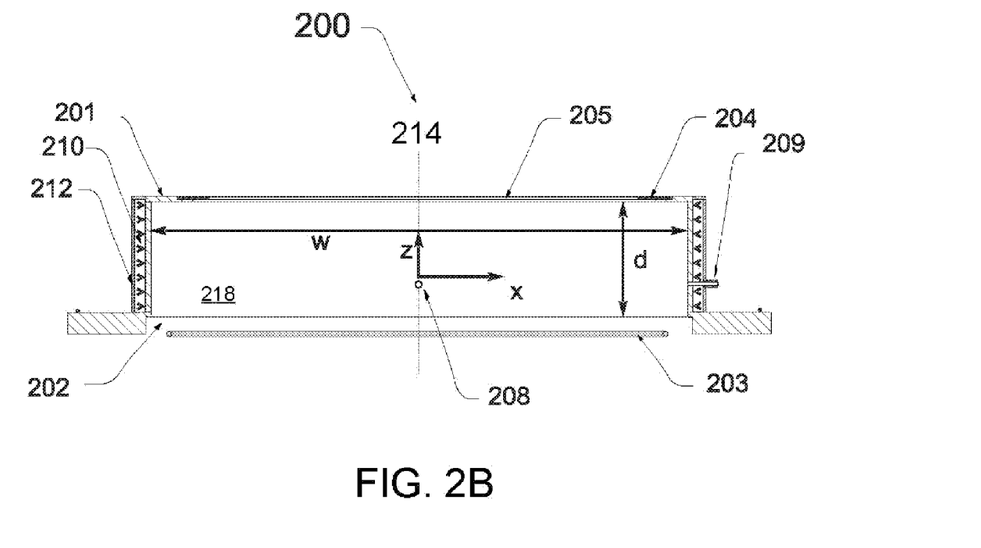
FIG. 2B shows a horizontal cross section of an ICP plasma source according to one embodiment.

A horizontal cross-section through the plasma source 200 is presented in FIG. 2B. In this embodiment, the gas inlets 208 are centered along the plasma chamber body 201 width (w). In other embodiments, the gas inlets 208 are positioned such that they are located on top and bottom and are symmetrical about the horizontal midline 214. In another embodiment, more than two gas inlets 208 are used. In some further embodiments, these gas inlets 208 are positioned so as to be symmetric and uniformly distributed about width of the plasma chamber body 201. In other words, the gas inlets 208 may be equi-spaced in x direction.

For proper gas dissociation and subsequent ionization, the gas pressure within the plasma source 200 is preferably maintained in the range of 1 mTorr to 99 mTorr. For pressure monitoring, a pressure gauge such as Baratron or Pirani is preferably connected to the chamber by using the port 209. The gas pressure in the chamber is controlled by the gas flow rate and the conductance of the extraction slit 205. For an independent pressure control, in another embodiment, two large vacuum conductance-pumping ports are located on the source side walls.

Figure 2C:
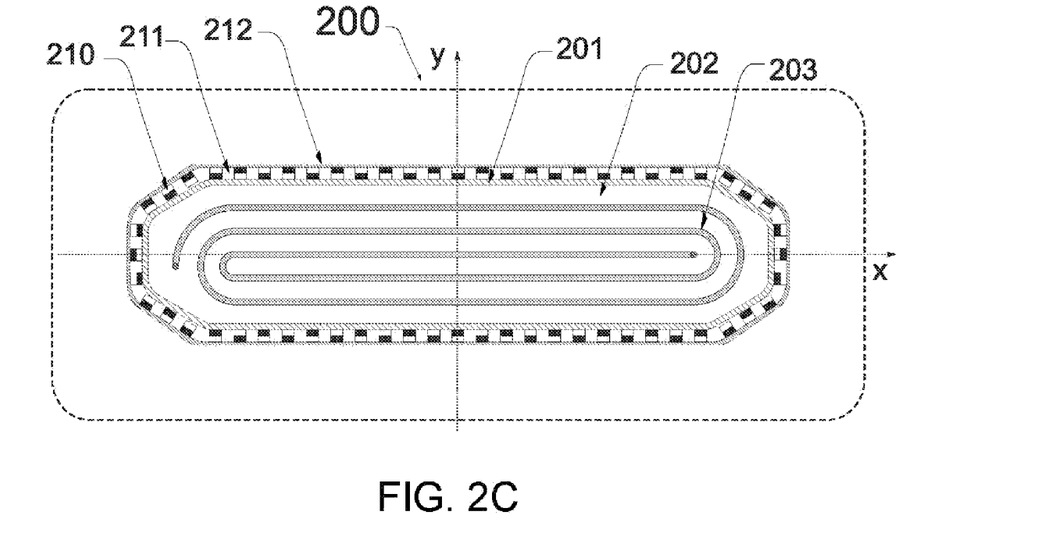
FIG. 2C shows a front view of an ICP plasma source according to one embodiment.
Figure 2D:
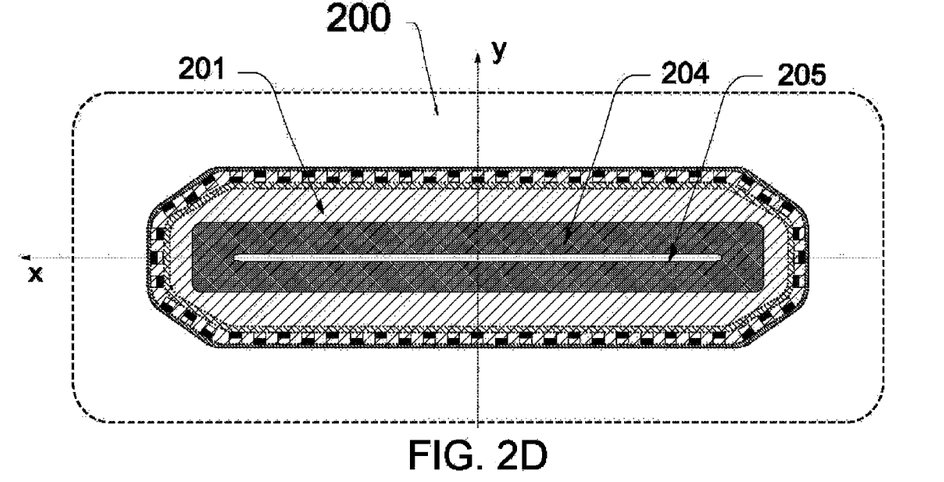
FIG. 2D shows an end view of an ICP plasma source having one extraction slit according to one embodiment.

A front view of the plasma source 200 is depicted in FIG. 2C. For the clarity of the figure, some details are omitted. In this embodiment, the corners of the chamber body 201 are tapered to approximately follow the elongated spiral-like antenna shape, thereby forming an octagonal shaped body. In other embodiments, the chamber body 201 may be an elongated oval, such as a rectangular cuboid having half cylinders at opposite ends. In other embodiments, the chamber body 201 may be any oblong geometry having two orthogonal dimensions, where the length in one of the dimensions is greater than the length in the second dimension.

Different than solenoidal antennae, this geometry provides a parallel orientation of the induced electric field with respect to the dielectric window plane. As a result, electrons are accelerated in directions parallel to the x direction. The straight portions of the antenna turns are parallel with the extraction slit orientation and are longer than the slit waist, therefore uniform plasma density is expected along x direction in the spatial range were the extraction slit is located.

As shown in FIGS. 2A-B, extraction slit 205 is along x direction, and is symmetrically spaced from the top and bottom walls of the chamber body 201, along the vertical midline 213. The position of the extraction slit 205 can be better seen in FIG. 2D, where an end view of the plasma chamber body 201 is depicted. Depending on the desired extracted current linear density value and available extraction optics, the extraction slit 205 height may be between approximately 2 to 5 mm. The width of the extraction slit 205 is determined by the width of the ribbon beam that is to be extracted from the plasma source 200. To implant 450 mm diameter wafers, a ribbon ion beam having at least 500 mm width may be used.

Figure 2E:
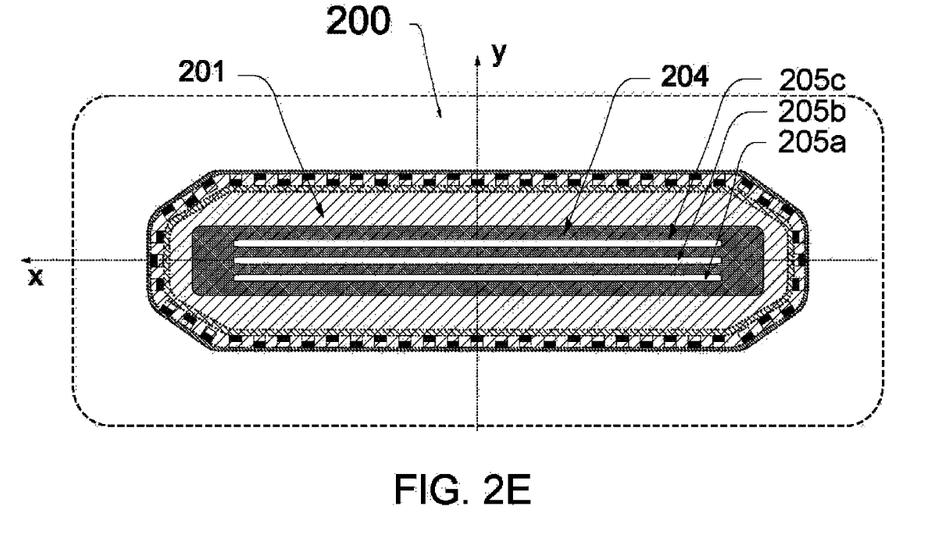
FIG. 2E shows an end view of an ICP plasma source having three extraction slits according to another embodiment.

To allow extraction of positive ions, the plasma chamber body 201 is electrically biased at positive potential by a high voltage DC power supply (not shown). Extraction optics comprised of a set of electrodes of various electrical potentials, such as shown in FIG. 1A, may be used in conjunction with the plasma source 200. In one embodiment, shown in FIG. 2D, a single extraction slit 205 is used to extract the ion beam. In other embodiments, multiple extraction slits 205a-c, such as is shown in FIG. 2E, are used to extract multiple beamlets for the purpose of increasing the extracted current and/or multiple line implants.

For higher plasma densities and better uniformity, magnetic multicusp confinement structures may be used. FIGS. 2A-E show views of an azimuthal multicusp configuration. An array of magnets 210, which may be permanent magnets, and spacers 211 surround the chamber body 201. The magnets 210 may have a square cross-section. In some embodiments, the magnets 210 have a 9.5×9.5 mm$^2$ cross-section and a longer dimension of 157 mm. The magnets 210 may be made of a magnetic material that is temperature-resistant up to approximately 350° C., such as Sm—Co (samarium-cobalt). The spacers 211 are positioned between the magnets 210, and are made of a non-magnetic material, such as aluminum. The magnets 210 are arranged in an alternating pattern. For example, the magnetization vector of one magnet 210 is perpendicular to the chamber body 201 wall with the direction pointing inward, whereas the adjacent magnets 210 have the magnetization vector oriented outward. To increase the magnetic field strength inside the chamber 218 and to shield long range field lines outside the chamber 218, a magnetic yoke 212, such as one constructed from iron or magnetic steel, may be used to cover the magnetic multicusp confinement structure, thus providing a short path for the magnetic field lines that lie outside the plasma source 200. As shown in FIGS. 2A-E, for proper functioning of the cusp configuration, good magnetic symmetry is preferable. For example, a S-N oriented magnet at (x=0, y=+d/2), where x=0 and y=0 define the vertical and horizontal midlines, respectively, on the top side of the chamber body 201 (see FIG. 2C) should face a N-S oriented magnet at (x=0, y=−d/2) on the bottom side of the chamber body 201. Similar on all other sides of the plasma chamber; an N-S oriented magnet at (x=−w/2, y=0) should face on the opposite side at (x=+w/2, y=0) of an S-N oriented magnet. Lack of magnetic symmetry may result in top-bottom magnetic dipole configurations that will cause trapping of the charged particles at certain spatial locations with a detrimental effect on plasma uniformity.

The magnetic cusp structure shown in FIGS. 2A-E is defined as azimuthal because the magnets 210 are aligned with the longest dimension along z and, except for the cusps locations, the resultant magnetic field is oriented along the perimeter of the chamber body 201.

Figure 3A:
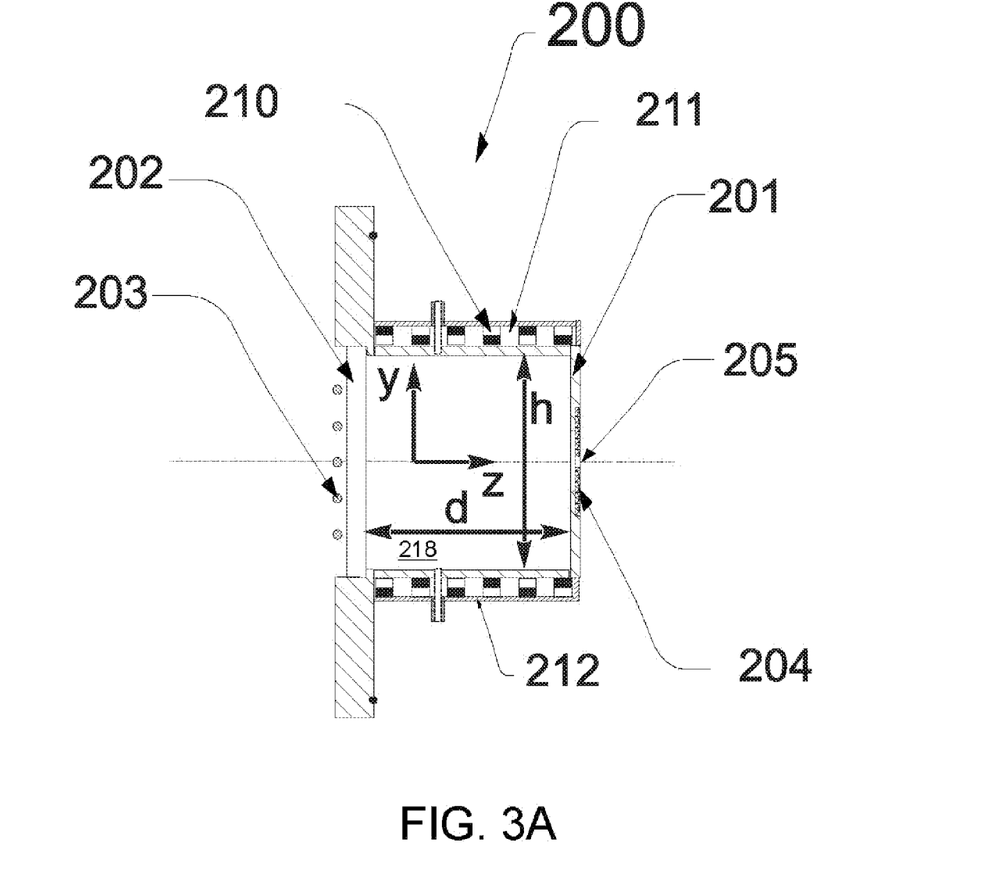
FIG. 3A shows a vertical cross section of an ICP plasma source according to a second embodiment, with an axial magnetic cusp field geometry.
Figure 3B:
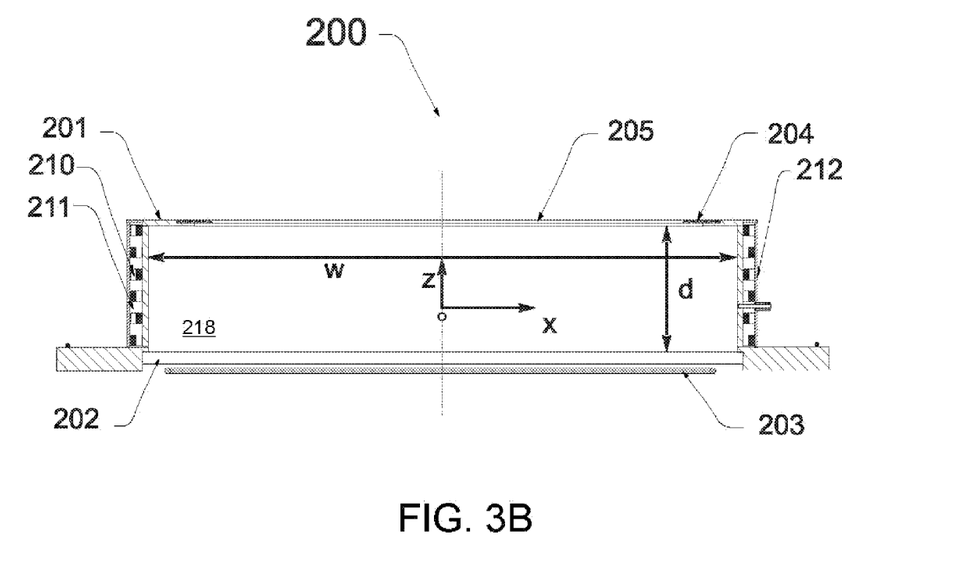
FIG. 3B shows a horizontal cross section of an ICP plasma source according to a second embodiment, with an axial magnetic cusp field geometry.
Figure 3C:
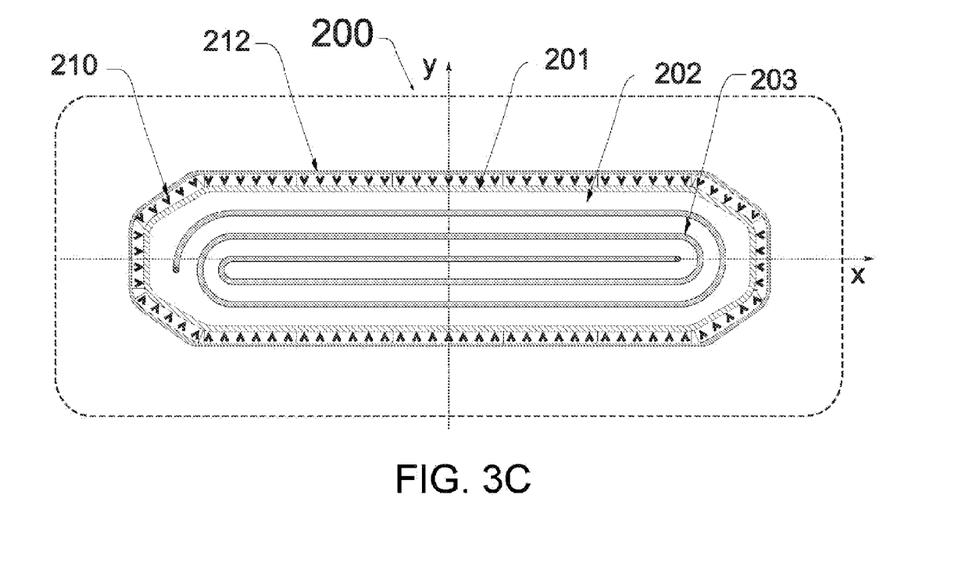
FIG. 3C shows a front view of an ICP plasma source according to a second embodiment, with an axial magnetic cusp field geometry.

In another embodiment, defined as an axial cusp shown in FIGS. 3A-C, the magnets 210 are oriented with the longest dimension along the perimeter of the chamber body 201 and the resultant magnetic field is along z direction. FIG. 3A shows a vertical cross-sectional view of the chamber 318, where the axial orientation of the magnets 210 can be seen. Similarly, FIG. 3B shows a horizontal cross-section, showing the orientation of the magnets 210.

Having defined the components of the plasma source 200, the constraints associated with each chamber dimension, antenna shape and size, and magnetic cusp topology will be described.

The width of the chamber (i.e. w in FIGS. 2A-E and 3A-C) is determined by the desired width of the ribbon ion beam. For example, for a 500 mm wide ribbon ion beam, the width of the chamber may be a distance between 600 mm and 700 mm, such as 660 mm. Larger width ribbon beams would require correspondingly larger chamber widths.

For bounded plasma, the ionization frequency is independent on the discharge power and plasma density, but is a function of electron temperature ($T_e$), gas pressure (p) and characteristic plasma length (L). The characteristic plasma length (L) is given by the ratio between the plasma volume and the plasma boundary surface. For specific operating conditions, the characteristic plasma length value is given by the equilibrium between the volume plasma production and plasma loss to the wall. Since one dimension of the plasma chamber is set by the desired width of the ion beam, the plasma production is best described in terms of plasma chamber form factor $\xi$.

For a cylindrical plasma chamber, such as the ICP plasma source 100 shown in FIG. 1A, the form factor is typically defined as the ratio of the plasma chamber depth to the plasma chamber diameter. For a rectangular geometry, or an oblong geometry in which one dimension is greater than the second dimension, the form factor may be defined as the ratio of the plasma chamber depth (d) to the geometrical mean of the other two orthogonal dimensions (w and h) as defined by Equation 6:

$$\xi \cong \frac{d}{\sqrt{wh}} \tag{6}$$

For the present embodiment, where one dimension is much greater than the other two dimensions, the form factor scales with the characteristic plasma length (L) as seen in Equation 7:

$$\xi \sim \frac{1}{\sqrt{L}} \tag{7}$$

Because the energy balance equation shows that plasma density is determined only by the discharge power and the product of gas pressure (p) and plasma length (L), it follows that a large characteristic plasma length (L) to promote the volume plasma production will require a small plasma chamber form factor $\xi$. On other hand, in the present plasma chamber geometry, the RF power coupling from the antenna to the plasma does not take place in the plasma bulk but at the plasma edge. Furthermore, the maximum power deposition occurs over a distance equal with the skin depth. Therefore, a plasma chamber with a depth of the order of skin layer thicknesses will provide the highest plasma density for a given input power and transversal dimensions w and h. In designing the depth of the plasma source, it should be noted that ionization processes take place at and beyond the skin layer. For a typical 13.56 MHz ICP argon plasma, the tail of the electron energy distribution function (eedf) above 25-30 eV is relatively well populated. This would imply that energetic electrons might exist and ionization collisions might occur beyond the skin depth. This phenomenon may be more pronounced in molecular plasmas for which ionization energies are lower than for noble gases. However, beyond a certain distance from the antenna and in the absence of any magnetic confinement, the plasma density decays exponentially with the distance from the antenna.

Besides plasma density, for large area implantation or deposition purposes, another constraint on the depth of the plasma chamber comes from the necessity of having a uniform plasma over extended dimensions. If the depth is too small, a non-uniform plasma density reflecting the antenna pattern at the extraction slit or the deposition substrate spatial location will result.

Approximating the plasma chamber 218 as shown in FIGS. 2A-E and 3A-C, as a rectangular box, and assuming that the first zero of the fundamental diffusion mode coincides with the plasma chamber wall surfaces, the plasma density distribution is given by Equation 8:

$$n(x, y, z) = n(0, 0, 0)\cos\left(\frac{\pi x}{w}\right)\cos\left(\frac{\pi y}{h}\right)\cos\left(\frac{\pi z}{d}\right) \tag{8}$$

for which the characteristic diffusion length is given by Equation 9:

$$\frac{1}{\Lambda^2} = \left(\frac{\pi}{w}\right)^2 + \left(\frac{\pi}{h}\right)^2 + \left(\frac{\pi}{d}\right)^2 \tag{9}$$

A rough estimation (without taking into consideration the wall reflection coefficients in the x and y directions due to the multicusp magnetic field confinement and the effect of vacuum pumping along z direction) yield a value of $\Lambda$ equal to ~3 cm. Using a diffusion coefficient for $BF_2^+$ ion (the main ionic component of the $BF_3$ plasma) of approximately $5 \times 10^4$ cm$^2$/s and a reasonable ion temperature of approximately 0.05 eV, this results in a diffusion mean free path of approximately 3-4 cm. Allowing for several diffusion mean free paths for high plasma uniformity will give the lower bound of the plasma chamber depth (d in FIGS. 2A-E and 3A-C) of approximately 10-12 cm. Similar calculus for different ions may result in different diffusion lengths and different optimal plasma chamber depths. However, the plasma chamber is intended to run different precursor gases, and the plasma density can be controlled by adjusting operational parameters (the RF power and gas pressure). Additionally, the plasma uniformity is set mainly by the plasma chamber design. Therefore, in most embodiments, the depth of the plasma chamber 218 may be between 10 and 20 cm. Based on these considerations, for the plasma chamber shown in FIGS. 2A-E and 3A-C, which is intended to generate plasma in a multitude of precursor gases ($BF_3$, $PF_4$, $PH_3$, $AsF_3$, $GeF_4$, $CO_2$, $SiF_4$, $N_2$, Ar, Xe, etc), the depth of the chamber may be about 14 cm. Then according to the above equation, the form factor ($\xi$) is approximately 0.32.

One feature of the described plasma source is antenna geometry. First, for a uniform extracted ion beam, plasma excitation has to span over wider length than the extraction slit. If multiple extraction slits are used, then antenna should also extend in the y dimension. In one embodiment, the antenna is 610 mm in the x direction and 76 mm in the y direction. This large surface coverage will imply a long antenna path and possibility of creation of standing waves with a detrimental effect on plasma uniformity. In the described embodiment, the total antenna length is approximately 2 m, thus being smaller than a quarter wavelength corresponding to 13.56 MHz electromagnetic radiation in copper. However, if longer antenna lengths are needed, a lower RF driving frequency (longer associated wavelength) may preferably be used. In some embodiments, lower frequencies, such as 0.46 MHz and 2 MHz are used. In other embodiments, higher frequencies, such as 27 MHz and 60 MHz, are used. Second, the elongated spiral shape used in the present embodiment allows alternation of the high and low voltage points on each side of the antenna thus leading to better plasma uniformity. Furthermore, whereas one leg of the antenna is connected to the RF generator the other is connected to the ground through a capacitor that compensates for the inductive voltage (proportional with the antenna inductance of approximately 2.5 µH) thus leading to uniform distribution of the voltage along the antenna length.

Figure 4A:
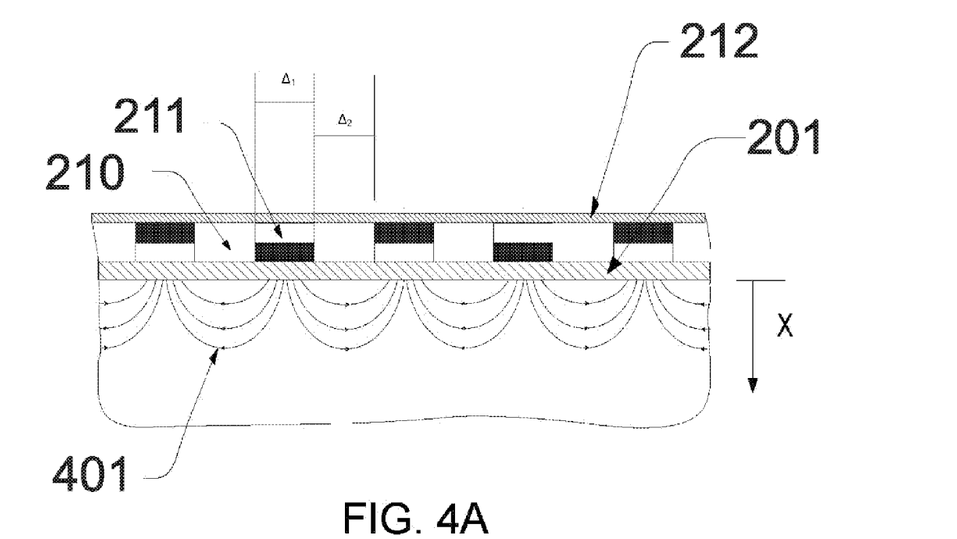
FIG. 4A shows the magnets and spacers displacement along with magnetic field lines in a cusp configuration.

Another feature of the described plasma source is the magnetic cusp configuration that surrounds the plasma chamber. As shown in FIG. 4A, except for an "effective" plasma leak area where the magnetic field lines intersect the surface of the chamber body 201, the resultant magnetic field lines 401 lie in planes parallel with the surface of the chamber body 201. As a result, the diffusion toward the walls or surfaces is drastically decreased by magnetically trapping the charged particles moving toward the walls or surfaces. The losses to the walls or surfaces which in the absence of the cusp configuration are proportional with the total chamber surface area (A) now are reduced to a fraction (f) proportional with the number of cusps (N) and the cusp leak area ($\Sigma$) as seen in Equation 10.

$$f = \frac{N\Sigma}{A} \quad (10)$$

As a consequence, the plasma density at the sheath edge ($n_{edge}$), i.e., where the extraction slit is located, and implicitly, the extracted ion current, will increase as defined by Equation 11:

$$n_{edge} = \frac{n_{bulk}}{\sqrt{1 + (kf)^2}} \quad (11)$$

In Equation 11, $n_{bulk}$ is the density of the bulk plasma, f is the fraction defined in Equation 10 and k is a factor depending on electron temperature and the nature of the ion. The second beneficial effect of the magnetic cusp configuration is the improvement in the uniformity of the plasma because highly energetic electrons which otherwise would be lost to the walls, now will be reflected back into the plasma where they will suffer new ionization collisions until they will be thermalized.

Figure 4B:
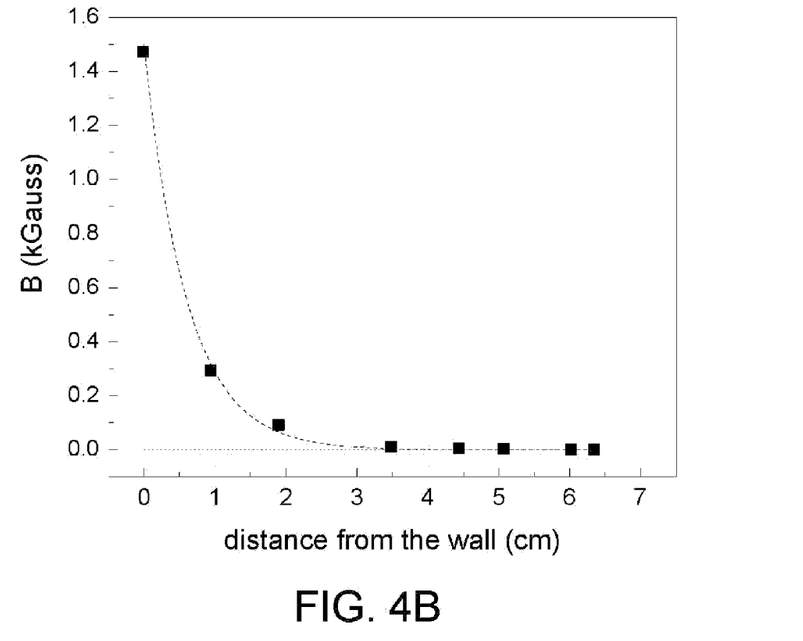
FIG. 4B shows the magnetic field penetration depth into the plasma chamber in the direction perpendicular to the chamber wall.
Figure 4C:
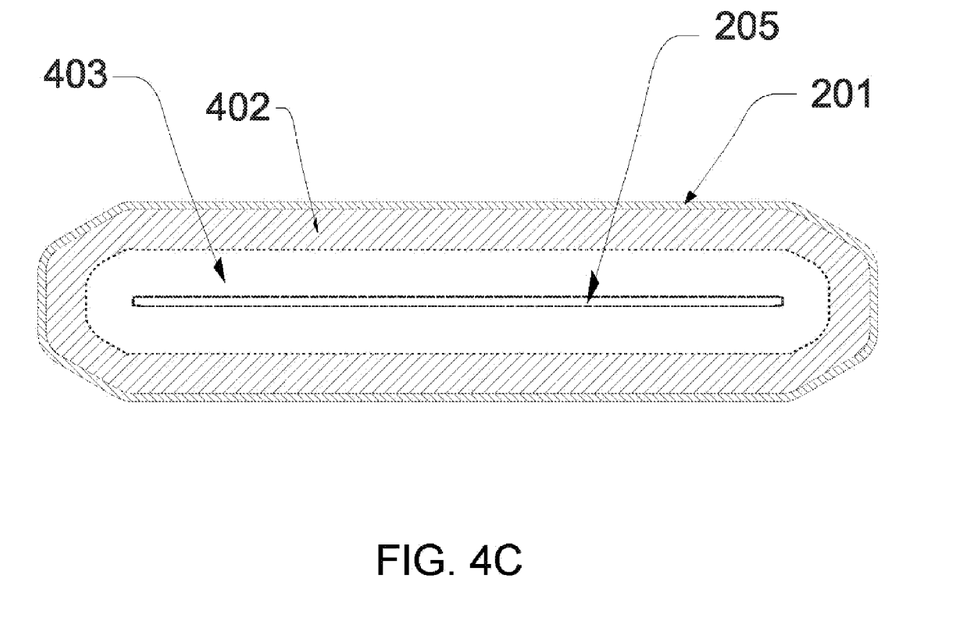
FIG. 4C shows the magnetic field free zone in the plasma chamber.

In designing the magnetic cusp configuration, special care should be paid to magnet separation. Equation 10 shows that decreasing the number of cusps reduces the loss fraction but at the same time the penetration of the field lines into the plasma volume deepens. In some embodiments, the width of the magnets 210 ($\Delta_1$) is about 10 mm. In some embodiments, the width of the spacers 211 ($\Delta_2$) is about 20 mm. The measured magnetic field strength (the component perpendicular on the wall surface) versus the depth ($\chi$) is shown in FIG. 4B. Experimental data (scatter graph) obey the theoretical prediction seen in Equation 12:

$$B(\chi) = \frac{2B_0\Delta_1}{\Delta_2}\exp\left(-\pi\frac{\chi}{\Delta_2 - \Delta_1}\right) \quad (12)$$

which is shown with continuous dashed line in FIG. 4B. In the above equation, $B_0$ is the magnetic field strength at the surface of the magnet, $\chi$ the distance in the direction perpendicular on the chamber wall, $\Delta_1$ and $\Delta_2$ the magnet width and magnet separation, respectively. As shown in FIG. 4C, the resultant magnetic field topology consists of a narrow zone 402 adjacent to the chamber body 201 where the magnetic field is present (magnetic field strength increases in the direction toward the wall) and a central magnetic field free region 403. The magnetic field free region 403 may preferably extend beyond the extraction slit ends for good ion beam uniformity. For the embodiment described herein, using 10 mm magnet width with 20 mm magnet separation, in an azimuthal configuration, the magnetic field strength drops from 1.5 kGauss at the plasma chamber surface to zero at about 3.5 cm from the wall. Depending on the number of extraction slits, the magnetic field penetration depth sets the plasma chamber height. In one embodiment, the height is between about 150 mm and 250 mm. This height allows for 5 extraction slits, each of which is 3 mm in height and spaced apart by about 10 mm. If a different number of extraction slits are used, the height can be adjusted accordingly. Thus, based on the dimensions of w and h given above, there is a central region of about 8 cm in height and 60 cm in width free of magnetic field.

Figure 5A:
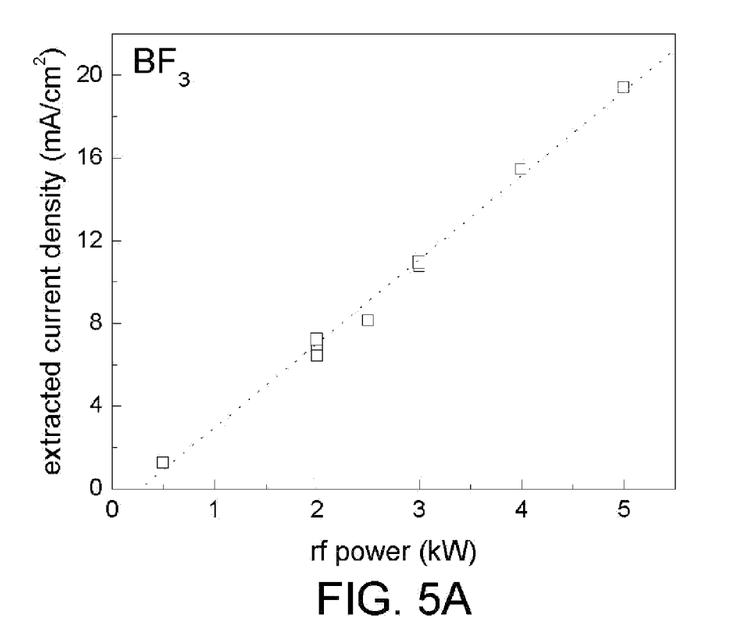
FIG. 5A shows the extracted ion beam current for $BF_3$ plasma.
Figure 5B:
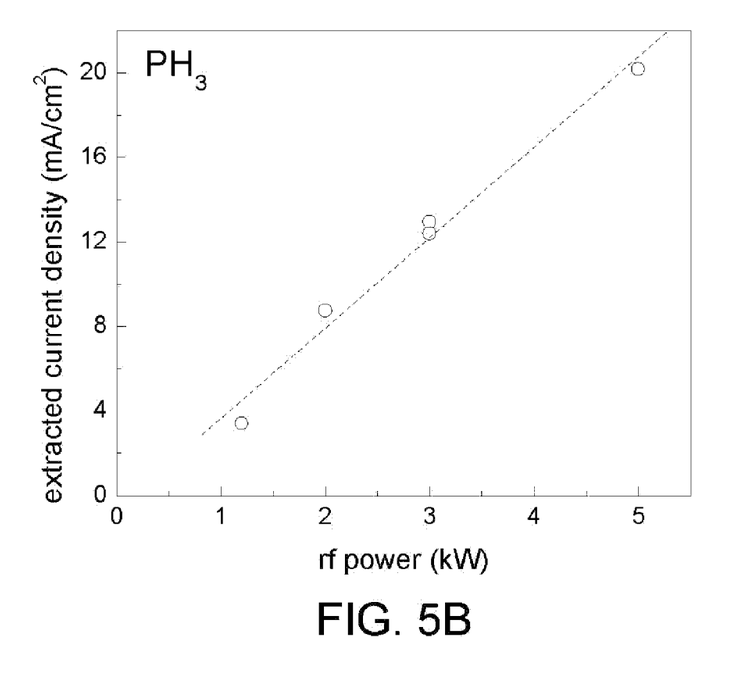
FIG. 5B shows the extracted ion beam current for $PH_3$ plasma.

FIGS. 5A and 5B show the extracted ion beam current densities obtained with the small form factor ($\xi \sim 0.32$) plasma source for two different precursor gases, $BF_3$ and $PH_3$, as a function of input power. As predicted, there is a linear relationship between the extracted beam current ($j_{extr}$) and the RF power, with a slope of approximately 4.06 mA/cm$^2$/kW and approximately 4.3 mA/cm$^2$/kW for $BF_3$ and $PH_3$, respectively. The high current density values demonstrate the very efficient coupling of the RF power to the plasma. Assuming an electron temperature of approximately 3 eV will result in a Bohm velocity ($v_b$) of the $BF_2$ ion of approximately $2.5 \times 10^5$ cm/s. This results in Equation 13:

$$n = \frac{j_{extr}}{ev_B} \quad (13)$$

where e is the elementary charge. Calculus shows a plasma density (n) of approximately $5 \times 10^{11}$ cm$^{-2}$ for 5 kW input RF power, i.e., close to the maximum attainable inductively coupled plasma (ICP) density.

The ion source described above allows the resulting plasma density and composition to be changed according to the desired beam current and elemental composition. Higher RF power and low flow rate (low pressure) will favor higher fractionation of the precursor gas. Higher flow rate (pressure) will favor an overall high plasma density. Depending on the nature of the precursor gas and the desired elemental beam composition different RF power-gas pressure (flow rate) can be chosen.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:
1. An inductively coupled plasma (ICP) source for extracting a ribbon ion beam, comprising:
   a chamber comprising chamber body comprising top, bottom and side surfaces, said chamber body having a length, a depth and a height, wherein said height is defined as a distance between said top surface and said bottom surface, said length is defined as a distance between said side surfaces and where said height is smaller than said length, a dielectric window; and an end opposite said dielectric window, having at least one elongated extraction slit parallel to and symmetrically spaced from said top and bottom surfaces, said elongated extraction slit extends between said side surfaces to extract a ribbon ion beam, and wherein said depth is defined as a distance between said dielectric window and said end opposite said dielectric window, and;

at least one gas inlet disposed in at least one of said top surface and said bottom surface of said chamber body to allow the flow of gas into said chamber;

an elongated planar spiral antenna configured to excite said gas in said chamber to form a plasma, said antenna located in close proximity and parallel to said dielectric window; and extraction optics located proximate said elongated extraction slit to extract ions from said plasma through said elongated extraction slit.

2. The ICP source of claim 1, further comprising a magnetic confinement structure proximate to said top surface, said bottom surface, and said side surfaces.

3. The ICP source of claim 2, wherein said magnetic confinement structure comprises:

a yoke comprising a magnetic material;

a plurality of magnets; and one or more non-magnetic spacers positioned between each of said plurality of magnets.

4. The ICP source of claim 3, wherein said plurality of magnets are arranged such that a north pole of one magnet faces said chamber, and a south pole of an adjacent magnet faces said chamber.

5. The ICP source of claim 3, wherein a longer dimension of said magnets is oriented along a perimeter of said chamber body.

6. The ICP source of claim 3, wherein a longer dimension of said magnets is oriented along said depth of said chamber body.

7. The ICP source of claim 2, wherein said magnetic confinement structure creates a magnetic field within said chamber, and said height is determined based on the desired number of extraction slits and the magnetic field penetration depth.

8. The ICP source of claim 2, wherein said magnetic confinement structure creates a magnetic field within said chamber, and a minimum value of said height is determined such that no magnetic field exists within that portion of said chamber corresponding to a vertical midline.

9. The ICP source of claim 1, wherein said depth is determined based on the optimal generation of plasma by said antenna.

10. The ICP source of claim 1, wherein said length is determined based on the desired width of said ribbon beam.

11. The ICP source of claim 1, wherein said gas inlets are located along a horizontal midline.

12. The ICP source of claim 1, wherein said antenna is energized at 13.56 MHz.

13. The ICP source of claim 1, wherein said antenna is energized at 0.46 MHz, 2.0 MHz, 27 MHz, or 60 MHz.

14. The ICP source of claim 1, wherein said chamber body comprises an octagon, wherein a tapered surface attaches said top surface and said bottom surface to each of said side surfaces.

15. The ICP source of claim 1, wherein said side surfaces of said chamber body comprise half cylinders attached to said top and bottom surfaces.

16. The ICP source of claim 1, wherein said elongated comprises straight portions and turns, and where said straight portions are parallel to said extraction slit.

17. The ICP source of claim 16, wherein said straight portions are longer than a longest dimension of said extraction slit.

18. An inductively coupled plasma (ICP) source for extracting a ribbon ion beam, comprising:

a chamber comprising a chamber body comprising top, bottom and two side surfaces, having an octagonal cross-section, wherein a tapered surface attaches said top surface to each of said side surfaces, a tapered surface attaches said bottom surface to each of said side surfaces, where said chamber body having a length, a depth and a height, wherein said height is defined as a distance between said top surface and said bottom surface, said length is defined as a distance between said two side surfaces and where said height is smaller than said length;

a dielectric window; and an end opposite said dielectric window, having at least one elongated extraction slit parallel to and symmetrically spaced from said top and bottom surfaces, said elongated extraction slit extending between said side surfaces to extract a ribbon ion beam, and wherein said depth is defined as a distance between said dielectric window and said end opposite said dielectric window;

at least one gas inlet disposed in at least one of said top surface and said bottom surface of said chamber body to allow the flow of gas into said chamber;

an elongated planar spiral antenna, configured to excite said gas in said chamber to form a plasma, said antenna located in close proximity and parallel to said dielectric window;

a magnetic confinement structure disposed along and proximate to said top surface, said bottom surface, said tapered surfaces, and said two side surfaces; and extraction optics located proximate said elongated extraction slit to extract ions from said plasma through said elongated slit.

19. The ICP source of claim 18, wherein said elongated comprises straight portions and turns, where said straight portions are parallel to said extraction slit, and are longer than a longest dimension of said extraction slit.

20. An inductively coupled plasma (ICP) source for extracting a ribbon ion beam, comprising:

a chamber comprising a chamber body comprising top, bottom and two side surfaces, having an octagonal cross-section, wherein a tapered surface attaches said top surface to each of said side surfaces, a tapered surface attaches said bottom surface to each of said side surfaces, where said chamber body having a length and a height, where said height is between 150 mm and 250 mm, and said length is between 600 and 700 mm;

a dielectric window; and an end opposite said dielectric window, separated from said window by between 100 and 200 mm, having at least one elongated extraction slit parallel to and symmetrically spaced from said top and bottom surfaces, said elongated extraction slit extending between said side surfaces to extract a ribbon ion beam;

at least one gas inlet disposed in at least one of said top surface and bottom surface of said chamber body to allow the flow of gas into said chamber;

an elongated planar spiral antenna, energized at 13.56 MHz, configured to excite said gas in said chamber to form a plasma, said antenna located in close proximity and parallel to said dielectric window;

a magnetic confinement structure proximate to said top surface, said bottom surface, said tapered surfaces, and said two side surfaces; and extraction optics located proximate said elongated extraction slit to extract ions from said plasma through said elongated slit.

* * * * *